(12) United States Patent
Furuhata (10) Patent No.: US 7,042,063 B2
(45) Date of Patent: May 9, 2006

(54) SEMICONDUCTOR WAFER, SEMICONDUCTOR DEVICE, AND PROCESS FOR MANUFACTURING THE SEMICONDUCTOR DEVICE

(75) Inventor: Shoichi Furuhata, Nagano (JP)

(73) Assignee: Fuji Electric Device Technology Co., Ltd., (JP)

( * ) Notice: Subject to any disclaimer, the term of this patent is extended or adjusted under 35 U.S.C. 154(b) by 0 days.

(21) Appl. No.: 10/797,923

(22) Filed: Mar. 10, 2004

(65) Prior Publication Data

US 2004/0232517 A1    Nov. 25, 2004

(30) Foreign Application Priority Data

May 7, 2003    (JP) .............................. 2003-129541

(51) Int. Cl.
*H01L 29/74* (2006.01)

(52) U.S. Cl. .................. 257/520; 257/620; 438/361

(58) Field of Classification Search ................ 438/361, 438/430, 458; 257/520, 620
See application file for complete search history.

(56) References Cited

U.S. PATENT DOCUMENTS

| | | | | |
|---|---|---|---|---|
| 4,040,878 A | * | 8/1977 | Rowe | .......................... 438/460 |
| 4,148,053 A | * | 4/1979 | Bosselaar et al. | ........... 257/129 |
| 4,544,937 A | * | 10/1985 | Kroger | ......................... 257/36 |
| 5,663,582 A | * | 9/1997 | Nishizawa et al. | ......... 257/136 |
| 5,852,326 A | | 12/1998 | Khandros et al. | ........... 257/692 |
| 2001/0028083 A1 | * | 10/2001 | Onishi et al. | ................ 257/328 |

FOREIGN PATENT DOCUMENTS

| | | |
|---|---|---|
| JP | 10-50772 A | 2/1998 |
| JP | 2000-164607 A | 6/2000 |
| JP | 2000-277542 A | 10/2000 |

\* cited by examiner

*Primary Examiner*—Thomas L. Dickey
(74) *Attorney, Agent, or Firm*—Rossi, Kimms & McDowell, LLP.

(57) ABSTRACT

A semiconductor wafer is disclosed in which a high concentration impurity layer is formed in a semiconductor wafer to a predetermined depth, in order to electrically connect electrodes formed on the principal face of the wafer without forming trenches and through holes in the wafer. An $n^{++}$ diffusion region is formed in the dicing region of a semiconductor wafer by ion implanting or diffusion. The diffusion region extends to an $n^{++}$ layer formed deep in the semiconductor wafer. The width of the $n^{++}$ diffusion region is made wide enough to account for the blade width of a dicer, so that an $n^{++}$ diffusion region remains at the outer periphery of each of the chips divided by the dicing operation. Bump electrodes on the wafer surface electrically connect with the $n^{++}$ layer deep in the semiconductor through the $n^{++}$ diffusion region.

8 Claims, 6 Drawing Sheets

SEMICONDUCTOR WAFER, SEMICONDUCTOR DEVICE, AND PROCESS FOR MANUFACTURING THE SEMICONDUCTOR DEVICE

BACKGROUND OF THE INVENTION

The present invention relates to a semiconductor wafer, a semiconductor device and a process for manufacturing the semiconductor device. More particularly, the invention relates to a semiconductor wafer to be used for manufacturing a semiconductor device, which is constructed by connecting a high concentration impurity layer existing at a predetermined depth from a principal face, electrically with bump electrodes disposed on the principal face through a high concentration impurity diffusion region extending from the principal face to the high concentration impurity layer; a semiconductor device manufactured by using the semiconductor wafer; and a process for manufacturing the semiconductor device.

A semiconductor element which is constructed by forming trenches having a depth extending from the principal face to the high concentration impurity layer and filling the trenches with metal, low-resistance silicon or high impurity concentration silicon, so that a high concentration impurity layer existing at a predetermined depth from the principal face may be electrically connected with electrodes formed on the principal face is well known in the art. See JP-A-2002-353452.

A well known alternative embodiment comprises a construction which takes an electric junction between the surface and back of a wafer through a metal layer covering the side faces of through holes formed over scribing lines. See JP-A-2002-261192. Also well known in the art is a method for making wiring patterns that are formed on the two faces of a substrate, mutually conductive, by forming through holes in the substrate and by filling up the insides of the through holes with a plating metal. See JP-A-2002-141440.

If, however, the trenches or through holes are formed in a semiconductor wafer or the like, as disclosed in the above prior art embodiments, the wafers are apt to be cracked or chipped when the semiconductor wafer or the like is handled in the manufacturing process of the semiconductor device. If the trenches or through holes are filled with metal or silicon, voids are apt to be left in the trenches or through holes. Finally, if the material for filling up the trenches or through holes is a metal, the semiconductor wafer warps, because the metal and the semiconductor have different coefficients of thermal expansion.

SUMMARY OF THE INVENTION

In order to address these problems in the prior art, the present invention provides a semiconductor wafer in which a high concentration impurity layer formed in the wafer at a predetermined depth can be electrically connected with electrodes formed on the principal face of the wafer without forming trenches and through holes in the wafer.

The present invention also provides a semiconductor device manufactured by using the semiconductor wafer, and a process for manufacturing the semiconductor device.

In order to achieve these and other objects, a semiconductor wafer according to the invention comprises a first conduction type low concentration impurity layer formed to a predetermined depth beneath a principal face of the wafer, a first conduction type high concentration impurity layer underlying said low concentration impurity layer, and a first conduction type high concentration impurity diffusion region formed along a portion or the entirety of dicing lines at the time of cutting into a plurality of chips. The diffusion region has a width larger than that of the cutting allowance for the dicing around the dicing lines and extending from the principal face to the high concentration impurity layer.

In this invention, for example, the high concentration impurity diffusion region may have a lattice-shaped plane pattern. Moreover, the high concentration impurity layer may have a resistance value not higher than 0.05 $\Omega \cdot cm$.

According to the invention, it is possible to provide a semiconductor wafer capable of manufacturing a semiconductor device. In the device, electrodes formed on the principal face of the semiconductor wafer electrically connect with the high concentration impurity layer formed deep in the semiconductor wafer through a high concentration impurity diffusion region, without forming trenches or through holes in the semiconductor wafer.

In order to achieve the aforementioned object, a semiconductor device according to the invention comprises a first conduction type low concentration impurity layer formed to a predetermined depth beneath a principal face of the wafer used to manufacture said device. A first conduction type high concentration impurity layer underlies the low concentration impurity layer, and a first conduction type high concentration impurity diffusion region extends from the principal face of the low concentration impurity layer to the high concentration impurity layer. The diffusion region is formed in a portion or the entirety of dicing regions that are used when a semiconductor wafer is cut into individual chips, and is on the outer edge of an element region having at least one semiconductor element formed therein.

In one embodiment, for example, the high concentration impurity layer may have a resistance value not higher than 0.05 $\Omega \cdot cm$. The element region may include a power semiconductor element and a control circuit for controlling the power semiconductor element. The high concentration impurity diffusion region may be electrically connected with at least one of a plurality of bump electrodes formed on the principal face.

It is possible to provide a semiconductor device, in which a high concentration impurity diffusion region electrically connects a high concentration impurity layer formed deep in the semiconductor substrate with electrodes formed on the principal face of the semiconductor substrate by forming the diffusion region in the dicing region of the outer peripheral portion of the semiconductor chip.

In order to achieve the aforementioned object, a process for manufacturing a semiconductor device according to the invention comprises forming a first conduction type high concentration impurity diffusion region in a semiconductor wafer. The wafer includes a first conduction type low concentration impurity layer formed to a predetermined depth beneath a principal surface of the wafer and a first conduction type high concentration impurity layer that underlies said low concentration impurity layer. The high concentration impurity diffusion region is formed along a portion or the entirety of dicing lines that are used at the time of cutting into a plurality of chips, and has a width larger than that of the cutting allowance for the dicing around the dicing lines and to extend from the principal face to said high concentration impurity layer. An element is formed in the semiconductor wafer and then the semiconductor wafer in which an element is formed is cut into individual chips by dicing.

The high concentration impurity diffusion region may be formed by covering the wafer with a mask while exposing it to a high-temperature gas containing an impurity only along a portion or the entirety of the dicing lines. Alternatively, the high concentration impurity diffusion region may be formed by covering only a portion or the entirety of the dicing lines with a material containing an impurity, and by leaving it at a high temperature.

According to this invention, it is possible to provide a semiconductor device in which all electrodes for electrically connecting to a high concentration impurity layer formed deep in the semiconductor substrate are formed on the principal face of the semiconductor substrate. The electrodes are connected to the high concentration impurity layer through high concentration impurity diffusion region formed in the dicing region of the outer peripheral portion of the semiconductor chips, without forming trenches or through holes in the semiconductor wafer.

DESCRIPTION OF PREFERRED EMBODIMENTS

An embodiment of the present invention will be described in detail with reference to the accompanying drawings. FIG. 4 to FIG. 7 are diagrams for explaining the construction of a semiconductor wafer according to the invention. FIG. 6 is a top plan view showing the schematic construction of the entirety of the semiconductor wafer. In FIG. 6, numeral 2 designates dicing lines showing the cutting lines at the time when semiconductor wafer 1 is cut into individual chips.

Along dicing lines 2, there is formed $n^{++}$ diffusion region 3, which is a high concentration impurity diffusion region. Specifically, $n^{++}$ diffusion region 3 is formed in a lattice-shaped plane pattern to enclose individual element regions 4, in which semiconductor devices are formed by executing a process for manufacturing them.

Figure 4:
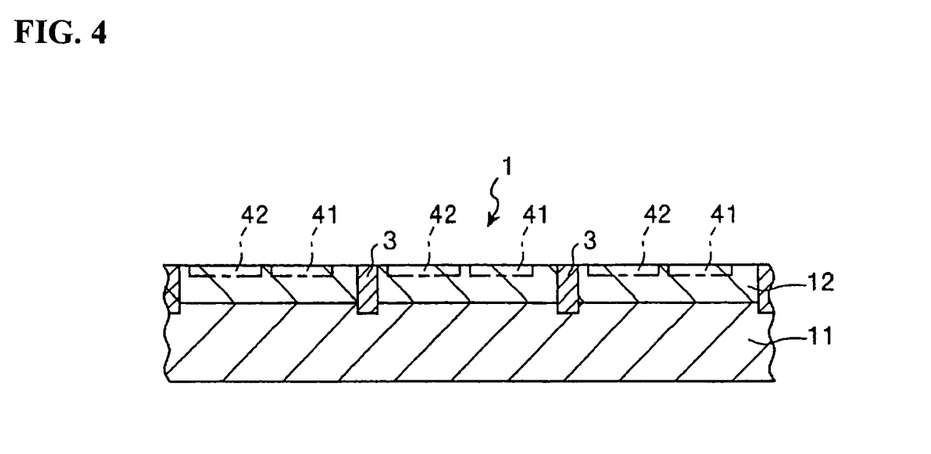
FIG. 4 is a longitudinal section schematically showing the construction of a portion of a semiconductor wafer according to the invention.
Figure 5:
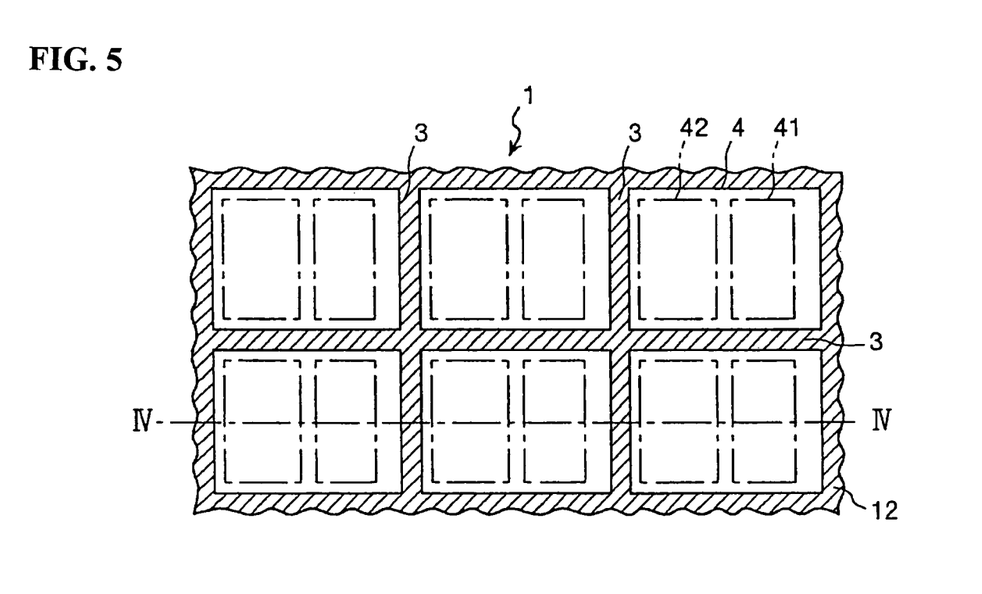
FIG. 5 is a top plan view schematically showing the construction of the portion of a semiconductor wafer according to the invention.
Figure 6:
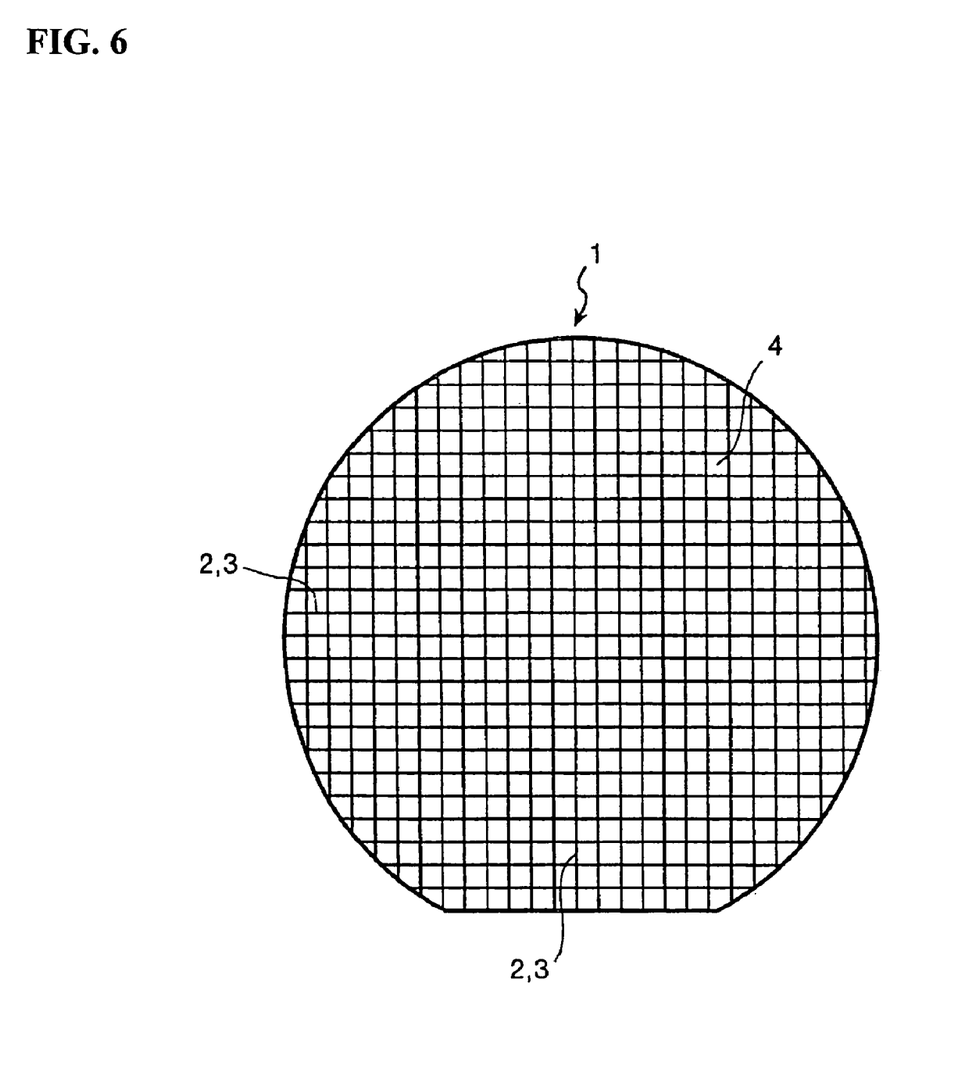
FIG. 6 is a top plan view showing a schematic construction of the semiconductor wafer according to the invention.

FIG. 5 is a top plan view schematically showing the construction of a portion of semiconductor wafer 1, and FIG. 4 is a longitudinal section showing the sectional construction taken along IV—IV of FIG. 5. In semiconductor wafer 1, as shown in FIGS. 4 and 5, $n^-$ layer 12, which a low concentration impurity layer, is formed over an $n^{++}$ layer 11, a high concentration impurity layer. $N^{++}$ diffusion region 3 is exposed to the surface of $n^-$ layer 12 and extends down to $n^{++}$ layer 11. In FIG. 5, the $n^{++}$ diffusion region 3 is hatched so that it may be easily viewed.

In FIGS. 4 and 5, numeral 41 designates power semiconductor element forming regions, in which power semiconductor elements such as power MOSFETs or IGBTs (Insulated Gate type Bipolar Transistors) are to be formed. Numeral 42 designates IC forming regions, in which control circuits for controlling the power semiconductor elements are to be formed.

Figure 7:
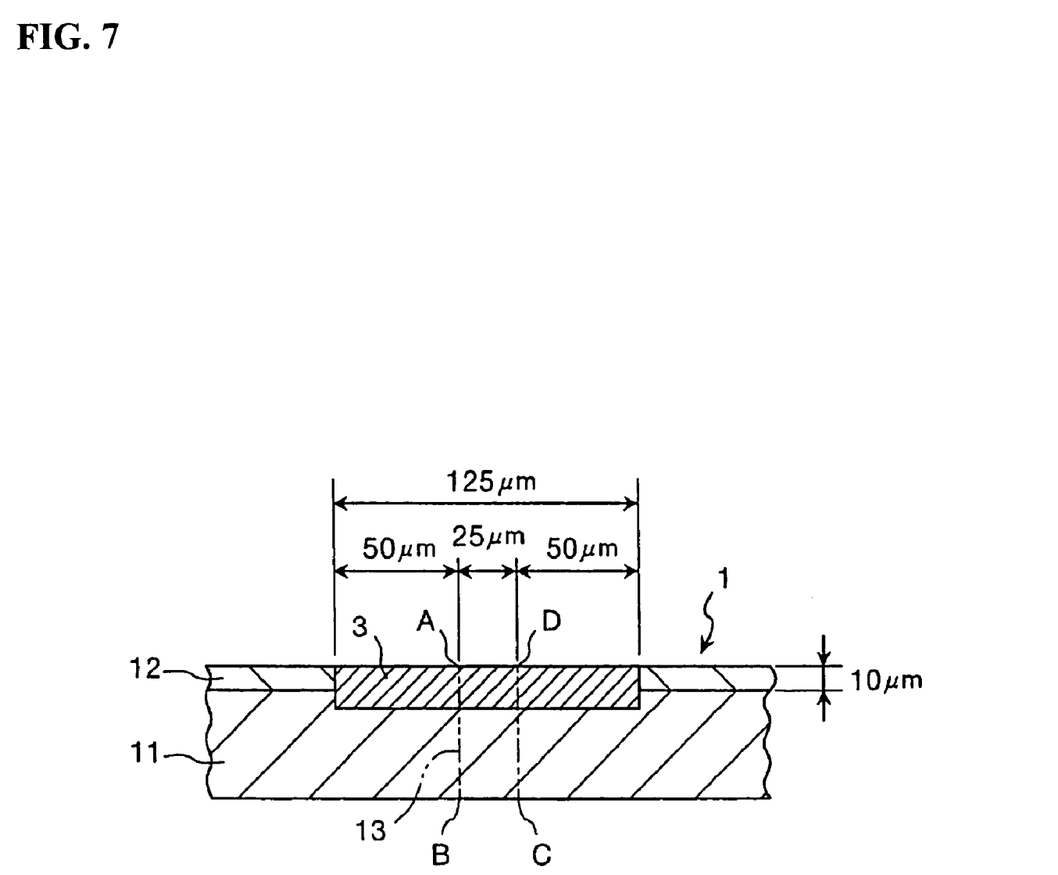
FIG. 7 is a sectional view explaining the sizes of an essential portion of the semiconductor wafer according to the invention.

Here will be described the sizes and electrical characteristics values of major portions of the device, in which the withstand voltage of the power semiconductor elements formed on semiconductor wafer 1 is as high as 60 V, for example, although not limited thereto. As shown in FIG. 7, for example, the thickness of the $n^-$ layer 12, i.e., the depth from the wafer surface to the $n^{++}$ layer 11, is about 10 μm. If each chip has a plane shape of a square of 3 mm×3 mm, it is necessary to leave the $n^{++}$ diffusion region 3 having a width of 50 μm at the outer periphery of each chip, as will be described later.

The portion to be removed by the blade of the dicer is the portion enclosed by A-B-C-D in FIG. 7. If a dicer having a blade width of 25 μm is used for the dicing, then cutting allowance 13 has a width of about 25 μm. Therefore, $n^{++}$ diffusion region 3 has a total width of about 125 μm (25 μm+50 μm+50 μm). In case each chip has a plane shape of a square of 2 mm×2 mm (an embodiment not shown), then $n^{++}$ diffusion region 3 has a width of 175 μm (25 μm+75 μm+75 μm) because $n^{++}$ diffusion region 3 of a width of 75 μm has to be left at the outer periphery of each chip, as will be described hereinafter.

Figure 8:
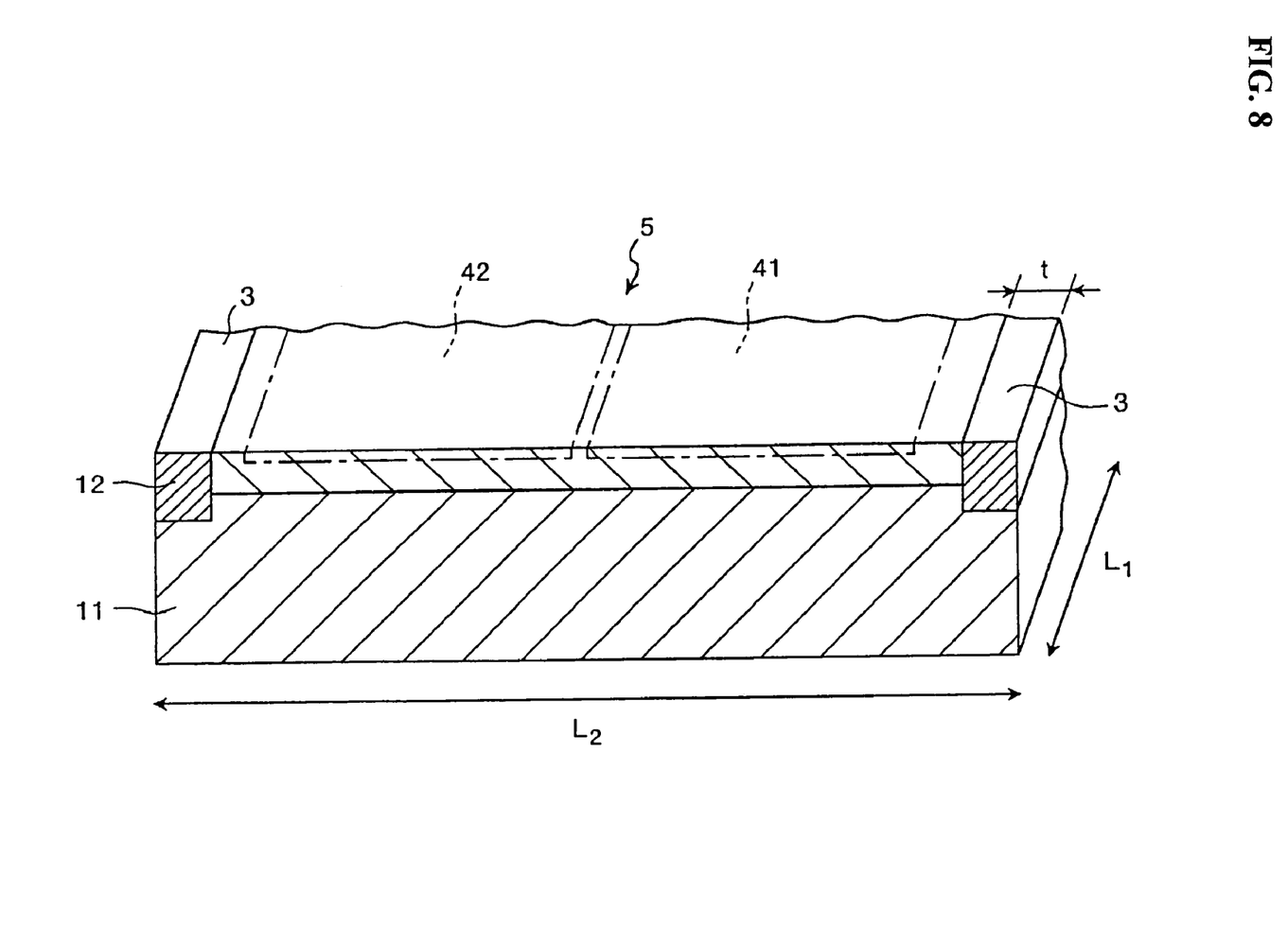
FIG. 8 is a sectional view explaining the sizes of an essential portion of the semiconductor device according to the invention.

Next, the reason why the width of $n^{++}$ diffusion region 3 left at the outer periphery of each chip must have the above-specified sizes will be explained. FIG. 8 is a sectional view for explaining the size of the essential portions of chip 5, which is obtained by dicing semiconductor wafer 1. It is assumed that $n^{++}$ diffusion region 3 has a width and lengths of t and $L_1$ and $L_2$, respectively, as shown in FIG. 8. It is further assumed that $n^{++}$ layer 11 has a resistance value of 0.018 Ω·cm, for example, and that the output stage MOSFET has an ON resistance value of 120 mΩ, for example.

It is also assumed that a resistance value allowed for the $n^{++}$ diffusion region 3 is 2.5%, for example. Therefore, the values t, $L_1$ and $L_2$ are calculated from the following Formula. Here, the depth from the wafer surface to $n^{++}$ layer 11 is about 0.001 cm (10 μm), as has been described above.

$$2(t(L_1+L_2))=0.018\ \Omega\cdot\text{cm}\times0.001\ \text{cm}/3\ \text{m}\Omega.$$

In the case of the chip size of 3 mm×3 mm, the values of $L_1$ and $L_2$ are 3 mm, so that the value t is calculated to 0.005 cm (50 μm) from the above Formula, as has been described above. The area of $n^{++}$ diffusion region 3, as exposed to the wafer surface, at this time is 0.60 mm² (=0.05 mm×3 mm×4). If the power semiconductor element has an ordinary working current of 3 A, the current density is 5×10² A/cm² (=3 A/0.60 mm²), which is so sufficiently as to raise no problem.

In the case of the chip size of 2 mm×2 mm, on the other hand, the values $L_1$ and $L_2$ are 2 mm. From the aforementioned Formula, therefore, the value t is 0.0075 cm (75 microns), as has also been described above. At this time, the exposed area of $n^{++}$ diffusion region 3 is 0.60 mm² (=0.075 mm×2 mm×4), and the current density is 5×10² A/cm² (=3 A/0.60 mm²).

Figure 1:
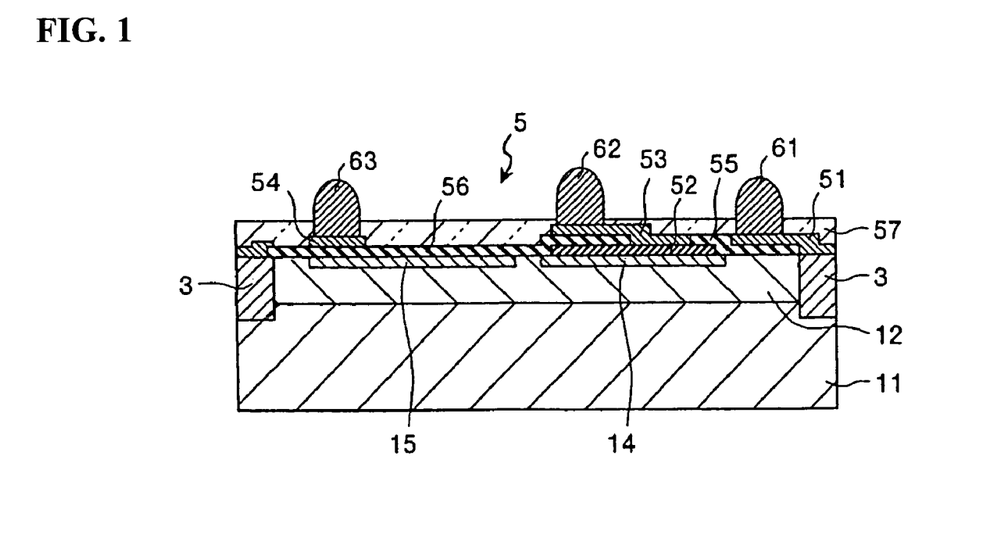
FIG. 1 is a longitudinal section schematically showing the construction of a semiconductor device according to the invention.
Figure 2:
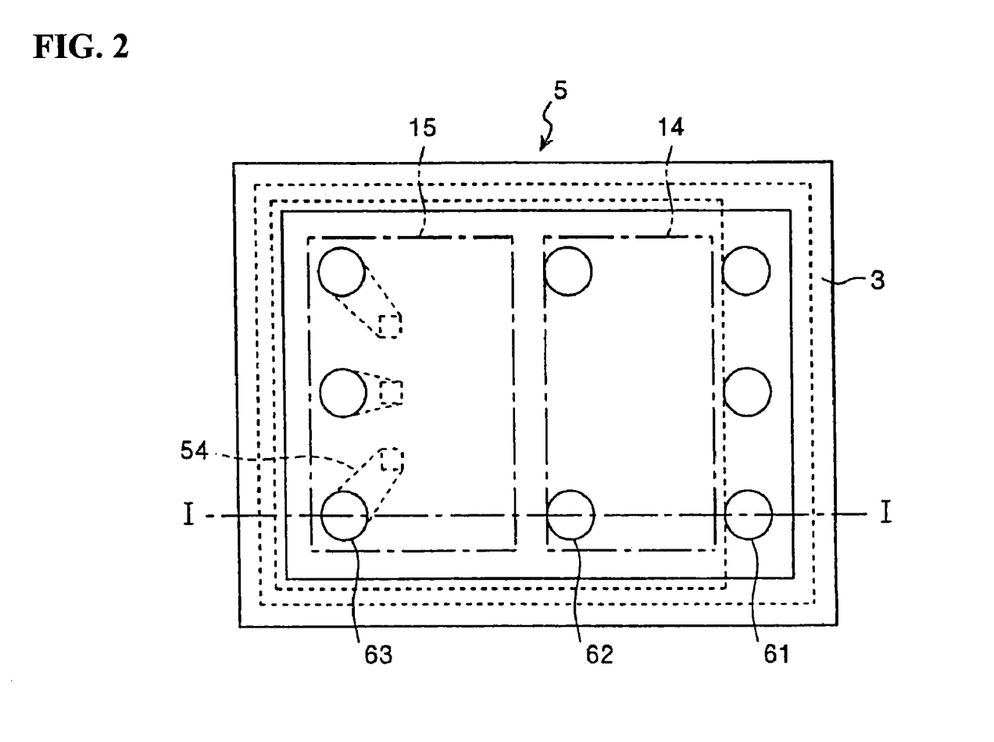
FIG. 2 is a top plan view schematically showing the construction of the semiconductor device according to the invention.

Next the construction of a semiconductor device manufactured by using semiconductor wafer 1 will be described. FIG. 1 is a longitudinal section schematically showing the construction of the semiconductor device. The longitudinal section is taken along I—I of FIG. 2. FIG. 2 is a top plan view schematically showing the construction of the semiconductor device according to the invention.

As shown in FIG. 1 and FIG. 2, $n^{++}$ diffusion region 3 is formed along the outer periphery of the semiconductor chip 5. As has been described above, $n^{++}$ diffusion region 3 is formed in the dicing region of semiconductor wafer 1. Moreover, $n^{++}$ diffusion region 3 extends to the $n^{++}$ layer 11 from the surface of $n^-$ layer 12 so that it is electrically connected with $n^{++}$ layer 11.

Conductive material 51 contacts ohmically with the surface of $n^{++}$ diffusion region 3. Conductive material 51 is provided with bump electrodes 61 at its leading ends. Therefore, $n^{++}$ layer 11 is electrically connected with the bump electrodes 61 through the $n^{++}$ diffusion region 3 and conductive material 51.

In semiconductor chip 5, on the other hand, there are formed power semiconductor element portion 14 and IC portion 15. In power semiconductor element portion 14, although not shown, there are formed MOSFETs, IGBTs, bipolar transistors, diodes or the like, for example. In IC portion 15, on the other hand, there is formed a CMOS device. Power semiconductor element portion 14 and IC portion 15 are manufactured in the (not-shown) p-well formed in $n^-$ layer 12 or in the (not-shown) n-well formed further in the p-well.

In power semiconductor element portion 14, conductive material 53 is connected with an electrode film 52, which is electrically connected with the not-shown power semiconductor device. Moreover, conductive material 53 is provided with bump electrodes 62 at its leading ends. Therefore, the not-shown power semiconductor device is electrically connected with bump electrodes 62 through electrode film 52 and conductive material 53.

In IC portion 15, bump electrodes 63 are formed at the leading ends of conductive material 54, which is electrically connected with the not-shown CMOS device or the like. In other words, the not-shown CMOS device is electrically connected with bump electrodes 63 through conductive material 54. Here, conductive materials 51, 53 and 54 and the electrode film 52 are suitably insulated from one another or from the semiconductor portion by insulating films 55 and 56. Moreover, conductive materials 51, 53 and 54 and electrode film 52 are covered with surface protecting film 57.

Bump electrodes 61, 62 and 63 provide the electric connection points with the not-shown circuit substrate when semiconductor chip 5 is packaged in the circuit substrate. In the present embodiment, all bump electrodes 61, 62 and 63 are formed on one principal face of semiconductor chip 5, although especially limited thereto. In short, semiconductor chip 5 is provided for the surface packaging.

Figure 3:
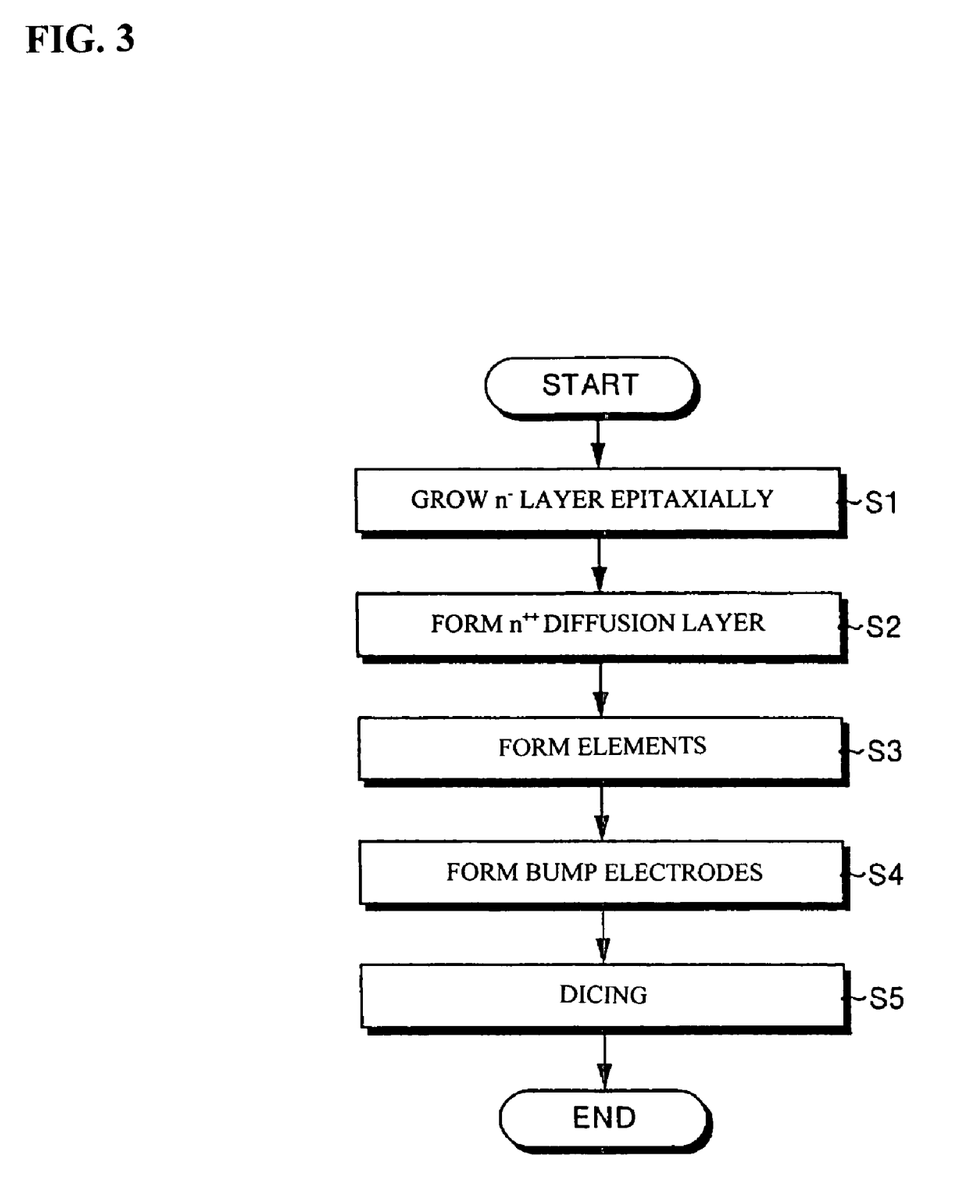
FIG. 3 is a flow chart explaining a process for manufacturing the semiconductor device according to the invention.

A process for manufacturing the semiconductor device now will be described. FIG. 3 is a flow chart explaining the manufacturing process. First of all, a wafer is prepared in Step S1, in which phosporus (P)-doped $n^-$ layer 12 having a thickness of about 10 microns is epitaxially grown over arsenic (As)-doped $n^{++}$ layer 11, for example. Next, $n^{++}$ diffusion region 3 is formed in Step S2 along dicing lines 2.

Any of the following three means can be applied for forming $n^{++}$ diffusion region 3. In the first means, impurity ions of phosphorus or the like are implanted into the region to form $n^{++}$ diffusion region 3, and the wafer is then subjected to a heat treatment at a predetermined high temperature for a predetermined time period thereby to thermally diffuse the impurity ions implanted. In the second means, a mask for exposing the region to form $n^{++}$ diffusion region 3 and for covering the remaining regions is formed over the wafer surface, and the wafer is left as it is in a high-temperature gas containing an impurity such as phosphorus for a predetermined time period. In the third means, the region of the wafer surface for forming $n^{++}$ diffusion region 3 is exposed, and the wafer is left as it is at a predetermined high temperature for a predetermined time period with its exposed face being covered with a material containing an impurity such as phosphorus.

In Step S3 devices are formed in power semiconductor element portion 14 and IC portion 15 individually by well-known manufacturing processes, and a description of the manufacturing processes of those devices is omitted here. Then, bump electrodes 61, 62 and 63 are formed in Step S4. In Step S5, the wafer is divided into individual chips 5 by a dicing operation, and the process is completed.

According to the embodiment thus far described, $n^{++}$ diffusion region 3 is formed to extend from the wafer surface to $n^{++}$ layer 11 formed deeply in the semiconductor wafer 1, so that bump electrodes 61, which are electrically connected with $n^{++}$ layer 11 through $n^{++}$ diffusion region 3, can be formed over the wafer surface. Therefore, it is possible to manufacture the semiconductor device having all of bump electrodes 61, 62 and 63 over one principal face of the semiconductor substrate, without forming trenches or through holes in semiconductor wafer 1.

According to the embodiment, moreover, neither trenches nor through holes are formed, and thus cracking or chipping of semiconductor wafer 1 during subsequent device manufacture can be prevented. In addition, there are no trenches or through holes that must be filled with metal, silicon or the like, and thus semiconductor wafer 1 will not suffer from voids or warping.

According to the invention, deep $n^{++}$ diffusion region 3 of a high impurity concentration is formed by using the dicing region on the chip surface and the region. This limits the extension of a depletion layer to be formed at the junction between $n^-$ layer 12 and the p-wells when the voltage is applied to the $n^-$ layer 12 through $n^{++}$ layer 11. Without inviting a drastic increase in the chip area, therefore, it is possible to provide semiconductor wafer 1 and the semiconductor device, which are provided with $n^{++}$ diffusion region 3.

Therefore, it is possible to realize such a chip size package (CSP) for the semiconductor element having a size equal to the chip size and electrodes on one principal face of the chip. For a dense and deep diffusion layer, generally, a large area is needed which produces a drastic increase in the chip area.

After $n^{++}$ diffusion region 3 was formed, according to the embodiment, the desired devices are individually manufactured in power semiconductor element portion 14 and IC portion 15, so that the devices can be prevented from receiving any unnecessary heat history.

The invention thus far described is not limited to the foregoing embodiment but can be modified in various manners. For example, the construction may be modified so that $n^{++}$ diffusion region 3 exists in a portion of the outer periphery of semiconductor chip 5. In the embodiment, the first conduction type is the n-type and the second conduction type is the p-type. However, the invention can also be practiced if the first conduction type is the p-type and the second conduction type is the n-type. Moreover, the above-specified sizes and electric characteristic values and so on are merely exemplary, and the invention should not be limited to these values. Furthermore, the invention can be applied to semiconductor materials other silicon, e.g., the invention also can be practiced with a chemical semiconductor such as SiC.

According to the invention, it is possible to provide a semiconductor wafer in which the electrodes to be electrically connected with a high concentration impurity layer formed deep in the semiconductor wafer are on the principal face of the semiconductor wafer, without forming trenches or through holes in the semiconductor wafer. It is also possible to provide a semiconductor device, which is constructed such that the electrodes to be electrically connected with the high concentration impurity layer formed deep in the semiconductor substrate are disposed on the principal face of the semiconductor substrate.

What is claimed is:

1. A semiconductor device comprising:
   a first conduction type low concentration impurity layer;
   a first conduction type high concentration impurity layer underlying said low concentration impurity layer; and
   a first conduction type high concentration impurity diffusion region that extends from the upper surface of said low concentration impurity layer to said high concentration impurity layer, said diffusion region being positioned at the outer edge of an element region having a semiconductor element formed therein,
   wherein said diffusion region comprises a portion or the entirety of dicing regions on a wafer containing said device, and
   wherein said element region comprises a power semiconductor element and a control circuit for controlling said power semiconductor element.

2. A semiconductor device according to claim 1, wherein said high concentration impurity diffusion region is electrically connected with at least one electrode formed on the upper surface of said low concentration impurity layer.

3. A semiconductor device according to claim 1, wherein said high concentration impurity diffusion region electrically connects said high concentration impurity layer with at least one electrode positioned above said low concentration impurity layer.

4. A semiconductor device comprising:
   a first conduction type low concentration impurity layer;
   a first conduction type high concentration impurity layer underlying said low concentration impurity layer, said high concentration impurity layer having a resistance value not higher than 0.05 Ω·cm; and
   a first conduction type high concentration impurity diffusion region that extends from the upper surface of said low concentration impurity layer to said high concentration impurity layer, said diffusion region being positioned at the outer edge of an element region having a semiconductor element formed therein,
   wherein said diffusion region comprises a portion or the entirety of dicing regions on a wafer containing said device, and
   wherein a plurality of high concentration impurity diffusion regions connect said high concentration impurity layer to a plurality of electrodes positioned above said low concentration impurity layer.

5. A process for manufacturing a semiconductor device as claimed in claim 1, comprising:
   forming a first conduction type high concentration impurity diffusion region in a semiconductor wafer, said wafer comprising a first conduction type low concentration impurity layer directly overlying a first conduction type high concentration impurity layer, wherein said diffusion region extends from an upper surface of said low concentration layer to said high concentration layer and is formed along a portion or the entirety of dicing lines to be used for cutting said wafer into a plurality of chips, and wherein said diffusion region has a width larger than that of the cutting allowance for the dicing tool;
   forming an element region comprising a power semiconductor element and a control circuit for controlling said power semiconductor element in said semiconductor wafer; and
   cutting said semiconductor wafer in which an element is formed into individual chips by dicing.

6. A semiconductor device manufacturing process according to claim 5, wherein said high concentration impurity diffusion region is formed by covering said wafer with a mask and exposing it only along a portion or the entirety of the dicing lines to a high-temperature gas containing an impurity.

7. A semiconductor device manufacturing process according to claim 5, wherein said high concentration impurity diffusion region is formed by covering only a portion or the entirety of the dicing lines with a material containing an impurity, and by leaving it at a high temperature.

8. A semiconductor device manufacturing process according to claim 5, wherein said high concentration impurity diffusion region is formed by ion implantation.

* * * * *